US012469684B2

(12) United States Patent
Shimizu

(10) Patent No.: US 12,469,684 B2
(45) Date of Patent: Nov. 11, 2025

(54) DECOMPRESSION PROCESSING METHOD FOR SUBSTRATE PROCESSING APPARATUS AND SUBSTRATE PROCESSING APPARATUS

(71) Applicant: Tokyo Electron Limited, Tokyo (JP)

(72) Inventor: Wataru Shimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 854 days.

(21) Appl. No.: 17/729,004

(22) Filed: Apr. 26, 2022

(65) Prior Publication Data

US 2022/0351943 A1 Nov. 3, 2022

(30) Foreign Application Priority Data

Apr. 26, 2021 (JP) ................................ 2021-074296

(51) Int. Cl.
*H01J 37/32* (2006.01)

(52) U.S. Cl.
CPC .. *H01J 37/32449* (2013.01); *H01J 37/32522* (2013.01); *H01J 37/32834* (2013.01); *H01J 37/32091* (2013.01); *H01J 2237/1825* (2013.01)

(58) Field of Classification Search
None
See application file for complete search history.

(56) References Cited

U.S. PATENT DOCUMENTS 4,977,688 A * 12/1990 Roberson, Jr. .... H01L 21/67034 34/76
5,115,576 A * 5/1992 Roberson, Jr. ............ F26B 5/04 34/76
8,372,212 B2 * 2/2013 Sato .......................... F26B 3/02 451/36
8,771,429 B2 * 7/2014 Ji ...................... H01L 21/67034 134/30
2011/0289793 A1 * 12/2011 Hayashi .................... F26B 3/04 134/30
2012/0047764 A1 * 3/2012 Campion .......... H01L 21/67057 34/493
2012/0247516 A1 * 10/2012 Sato .......................... F26B 3/02 34/201
2013/0019905 A1 * 1/2013 Ji ............................ F26B 21/14 34/443

FOREIGN PATENT DOCUMENTS

JP H07-335601 A 12/1995
JP 2006-210671 A 8/2006
JP 5-29448 B2 9/2012

* cited by examiner

*Primary Examiner* — David J Laux
(74) *Attorney, Agent, or Firm* — XSENSUS LLP

(57) ABSTRACT

There is provided a decompression processing method for a substrate processing apparatus including a chamber for processing a substrate in an inside thereof, a decompression unit that decompresses the inside of the chamber, and a gas supply that supplies a gas into the inside of the chamber, the method including supplying an additional substance mixable with moisture in a liquid or solid state by the gas supply to the inside of the chamber, forming the moisture into a mixture of the additional substance, and decompressing the inside of the chamber by the decompression unit to remove as a gas the mixture from the inside of the chamber.

20 Claims, 9 Drawing Sheets

DECOMPRESSION PROCESSING METHOD FOR SUBSTRATE PROCESSING APPARATUS AND SUBSTRATE PROCESSING APPARATUS

CROSS-REFERENCE TO RELATED APPLICATION

This application claims priority to Japanese Patent Application No. 2021-074296, filed on Apr. 26, 2021, the entire contents of which is incorporated herein by reference.

TECHNICAL FIELD

The present disclosure relates to a decompression processing method for a substrate processing apparatus and a substrate processing apparatus.

BACKGROUND

Patent Document 1 discloses an exhaust method in which the wall of an airtight container is heated to a desired temperature before the airtight container is opened to the atmosphere, the airtight container is maintained at a desired heating temperature for a desired time during opening to the atmosphere and during vacuum exhaust, and then the airtight container is cooled to a desired temperature.

PRIOR ART DOCUMENTS

Patent Documents

[Patent Document 1] Japanese Unexamined Patent Publication No. 5-029448

SUMMARY

Technical Problems

Techniques according to the present disclosure efficiently dry the inside of a vacuum chamber in a substrate processing apparatus.

Solutions to Problems

An aspect of the present disclosure is a decompression processing method for a substrate processing apparatus that supplies an additional substance mixable with moisture in a liquid or solid state by a gas supply to an inside of a chamber for processing a substrate in the inside of the chamber. A mixture of the moisture with the additional substance is formed. The method includes decompressing the inside of the chamber via operation of a decompression apparatus that reduces a pressure inside the chamber and removes the mixture in a gaseous form from the inside of the chamber.

Advantageous Effects

According to the present disclosure, it is possible to efficiently dry the inside of the vacuum chamber in the substrate processing apparatus.

DETAILED DESCRIPTION

Figure 1:
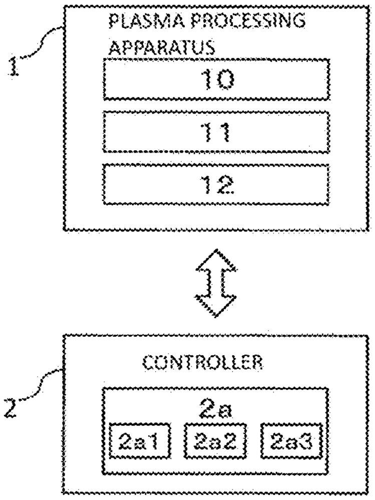
FIG. 1 is a plan view showing a schematic configuration of a plasma processing system of the present embodiment.

In a process of manufacturing a semiconductor device, a processing gas is supplied into a vacuum chamber accommodating a semiconductor wafer (hereinafter, referred to as a "wafer") and reacts with the wafer to perform wafer processing. A part surface inside the vacuum chamber exposed to the processing gas together with the wafer is made of a material that does not react with the processing gas, for example, anodized aluminum.

By the way, for example, moisture in the atmosphere may be mixed into the inside of the vacuum chamber opened to the atmosphere during the manufacturing process or the inside of the vacuum chamber opened to the atmosphere during the non-manufacturing process such as maintenance or the like. When the processing gas is supplied into the vacuum chamber in a state where moisture is mixed in the wafer processing, reaction products of the processing gas and moisture react with the part surface such as anodized aluminum, which may cause discoloration or deterioration of the part surface. Therefore, it is required to remove the moisture inside the vacuum chamber as much as possible before the supply of the processing gas, that is, to dry the moisture inside the vacuum chamber.

In the decompression processing method of the related art, a vacuum drying method is adopted in which the boiling point of the mixed moisture is lowered by creating a vacuum inside of the vacuum chamber and the moisture is retrieved as a gas. However, when the liquid moisture condensed on the part surface and the like evaporates during vacuum drying, the liquid moisture may become frozen due to heat loss from evaporation and thus turned into a solid. The rate of sublimation from solid moisture is lower than the rate of evaporation from liquid moisture, and therefore, it is considered that the time required for drying is lengthened. Further, in a case where solid moisture remains the inside of the vacuum chamber, the solid moisture dissolves due to an increase in pressure and a rise in temperature due to the heat input during the wafer processing, and causes the moisture to be released into the inside of the vacuum chamber.

Patent Document 1 discloses an exhaust method in which the inner wall of an airtight container is heated to a temperature equal to or higher than the evaporation temperature of water by heating the airtight container for a desired time during opening to the atmosphere and during vacuum exhaust in the airtight container. As a result, it is disclosed that adhesion of moisture to the inner wall of the airtight container may be suppressed, and condensation and dew condensation caused by decompression of moisture may be suppressed by similarly heating in the initial period of the vacuum exhaust to achieve a favorable high vacuum in the airtight container.

However, in the method disclosed in Patent Literature 1, it takes time to heat and maintain the vacuum chamber at a high temperature. Further, since microvoids are formed on the part surface made of anodized aluminum or the like, moisture that has entered the inside of the microvoids is not released from the microvoids even after heating and remains, and after the initial period of the above vacuum exhaust elapses, the moisture is again condensed and turned into a solid with the cooling, and thus the moisture may not be removed from the airtight container.

In view of the above-described problems, in the decompression processing method according to the present disclosure, the time required for drying the inside of the vacuum chamber in the manufacturing process, maintenance, or the like is shortened, and the inside of the vacuum chamber is appropriately dried.

Hereinafter, a plasma processing system provided with a plasma processing apparatus that is a substrate processing apparatus according to the present embodiment, and a decompression processing method for the plasma processing apparatus will be described with reference to drawings. The same reference numerals will be given to elements having substantially the same functional configurations throughout the specification, and redundant description thereof will be omitted.

<Plasma Processing System>

FIG. 1 is a plan view showing a schematic configuration of the plasma processing system of the present embodiment. In an embodiment, a plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. Further, the plasma processing chamber 10 includes at least one gas supply port for supplying at least one processing gas and an additional gas GA to be described later into the plasma processing space, and at least one gas exhaust port for exhausting the gas from the plasma processing space. The gas supply port is coupled to a gas supply 20 to be described later, and a gas exhaust port is coupled to a decompression unit 40 to be described later. The substrate support 11 is disposed in the plasma processing space and has a substrate support surface for supporting the substrate.

The plasma generator 12 is configured to generate plasma from at least one processing gas supplied into the plasma processing space. The plasma formed in the plasma processing space may be capacitively coupled plasma (CCP), inductively coupled plasma (ICP), electron-cyclotron-resonance plasma (ECR plasma), helicon wave-excited plasma (HWP), surface wave plasma (SWP), or the like. Further, various types of plasma generators, including an alternating current (AC) plasma generator and a direct current (DC) plasma generator, may be used. In one embodiment, an AC signal (AC power) used by the AC plasma generator has a frequency in a range of 100 kHz to 10 GHz. Accordingly, the AC signal includes a radio frequency (RF) signal and a microwave signal. In one embodiment, the RF signal has a frequency in a range of 200 kHz to 150 MHz.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. For example, the computer 2*a* may include a processor (central processing unit (CPU)) 2*a*1, a storage 2*a*2, and a communication interface 2*a*3. The processor 2*a*1 may be configured to perform various control operations based on a program stored in the storage 2*a*2. The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN). The above program is recorded in the storage 2*a*2 readable by the computer 2*a* and may be installed in the controller 2 from the storage 2*a*2. Further, the above storage 2*a*2 may be temporary or non-temporary.

Figure 2:
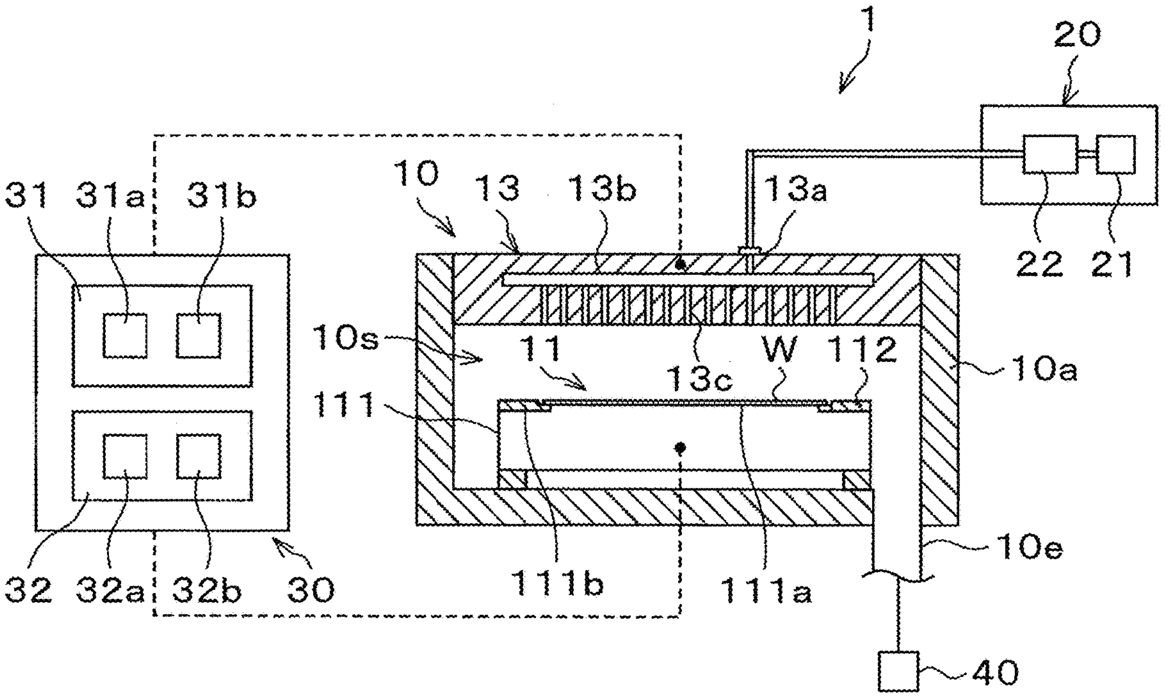
FIG. 2 is a plan view illustrating an example of a configuration of a plasma processing apparatus according to the present embodiment.

Next, an example of a configuration of a capacitive coupling plasma processing apparatus as an example of the plasma processing apparatus 1 will be described with reference to FIG. 2. The capacitive coupling plasma processing apparatus 1 includes a plasma processing chamber 10, a gas supply 20, a power source 30, and a decompression unit 40. Further, the plasma processing apparatus 1 includes a substrate support 11 and a gas introduction unit. The gas introduction unit is configured to introduce at least one processing gas and the additional gas GA into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The sidewall 10*a* is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111*a* for supporting the substrate (wafer) W, and an annular region (ring support surface) 111*b* for supporting the ring assembly 112. The annular region 111*b* of the main body 111 surrounds the central region 111*a* of the main body 111 in a plan view. The substrate W is disposed on the central region 111*a* of the main body, 111 and the ring assembly 112 is disposed on the annular region 111*b* of the main body 111 to surround the substrate W on the central region 111*a* of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has a substrate support surface 111*a*. The ring assembly 112 includes one or more annular members. At least one of the one or more annular members is an edge ring. Although not illustrated, the substrate support 11 may include a temperature control module as a temperature controller configured to adjust at least one of the electrostatic chuck, the ring assembly 112, and the substrate to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111*a*.

The shower head 13 is configured to introduce at least one processing gas and the additional gas from the gas supply 20 into the plasma processing space 10*s*. The shower head 13 has at least one gas supply port 13*a*, at least one gas diffusion chamber 13*b*, and a plurality of gas introduction ports 13*c*. The processing gas and the additional gas supplied to the gas supply port 13*a* pass through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas and the additional gas GA from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include at least one flow rate modulation device that modulates or pulses the flow rate of at least one processing gas and the additional gas GA.

In one embodiment, the introduction of the additional gas GA into the plasma processing chamber 10 is performed by using the gas supply 20 and the gas introduction unit, but the present disclosure is not limited thereto. For example, the plasma processing apparatus 1 may include an optional additional gas supply, provided separately from the gas supply 20 and the gas introduction unit, that introduces the additional gas GA into the plasma processing chamber 10.

The power source 30 includes an RF power source 31 coupled to plasma processing chamber 10 via at least one impedance matching circuit. The RF power source 31 is configured to supply at least one RF signal (RF power), such as the source RF signal and the bias RF signal, to the conductive member of the substrate support 11 and/or the conductive member of the shower head 13. As a result, plasma is formed from at least one processing gas supplied into the plasma processing space 10*s*. Accordingly, the RF power source 31 may function as at least a part of the plasma generator 12. Further, supplying of the bias RF signal to the conductive member of the substrate support 11 can generate a bias potential in the substrate W to draw an ion component in the formed plasma to the substrate W.

In one embodiment, the RF power source 31 includes a first RF generator 31*a* and a second RF generator 31*b*. The first RF generator 31*a* is coupled to the conductive member of the substrate support 11 and/or the conductive member of the shower head 13 via at least one impedance matching circuit, and configured to generate a source RF signal (source RF power) for plasma generation. In one embodiment, the source RF signal has a frequency in the range of 13 MHz to 150 MHz. In one embodiment, the first RF generator 31*a* may be configured to generate a plurality of source RF signals having different frequencies. The generated one or a plurality of source RF signals are supplied to the conductive member of the substrate support 11 and/or the conductive member of the shower head 13. The second RF generator 31*b* is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31*b* may be configured to generate a plurality of bias RF signals having different frequencies. The generated one or more bias RF signals are supplied to the conductive member of the substrate support 11. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is connected to the conductive member of the substrate support 11 and configured to generate a first DC signal. The generated first DC signal is applied to the conductive member of the substrate support 11. In one embodiment, the first DC signal may be applied to another electrode, such as an electrode in an electrostatic chuck. In one embodiment, the second DC generator 32*b* is configured to be connected to the conductive member of the shower head 13 and to generate a second DC signal. The generated second DC signal is applied to the conductive member of the shower head 13. In various embodiments, the first and second DC signals may be pulsed. The first and second DC generators 32*a* and 32*b* may be provided in addition to the RF power source 31, and the first DC generator 32*a* may be provided instead of the second RF generator 31*b*.

The decompression unit 40 may be coupled to, for example, a gas exhaust port 10*e* disposed at a bottom portion of the plasma processing chamber 10. The decompression unit 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The decompression unit 40 configured as described above can exhaust the inside of the plasma processing chamber 10 by vacuuming to be described later to decompress the inside.

The plasma processing apparatus 1 according to the present embodiment is configured as described above.

First Embodiment

Next, a decompression processing method MT1 for the plasma processing apparatus 1 according to a first embodiment will be described.

In the decompression processing method MT1 of the present embodiment, the inside of the plasma processing chamber 10 is dried by successively performing of steps ST1 to ST9 described below. The inside of the plasma processing chamber 10 includes the plasma processing space 10*s* and a part surface SF of the part exposed to the plasma processing space 10*s* among the parts that make up the plasma processing chamber 10. The parts of the present embodiment may include various metal parts such as a cooling plate subjected to an anodizing process. However, the parts of the present embodiment are not limited thereto. In addition to the above, parts that include parts exposed to the plasma processing space 10*s* and that allow the additional gas GA to be introduced into the part surface SF may be included.

Figure 3:
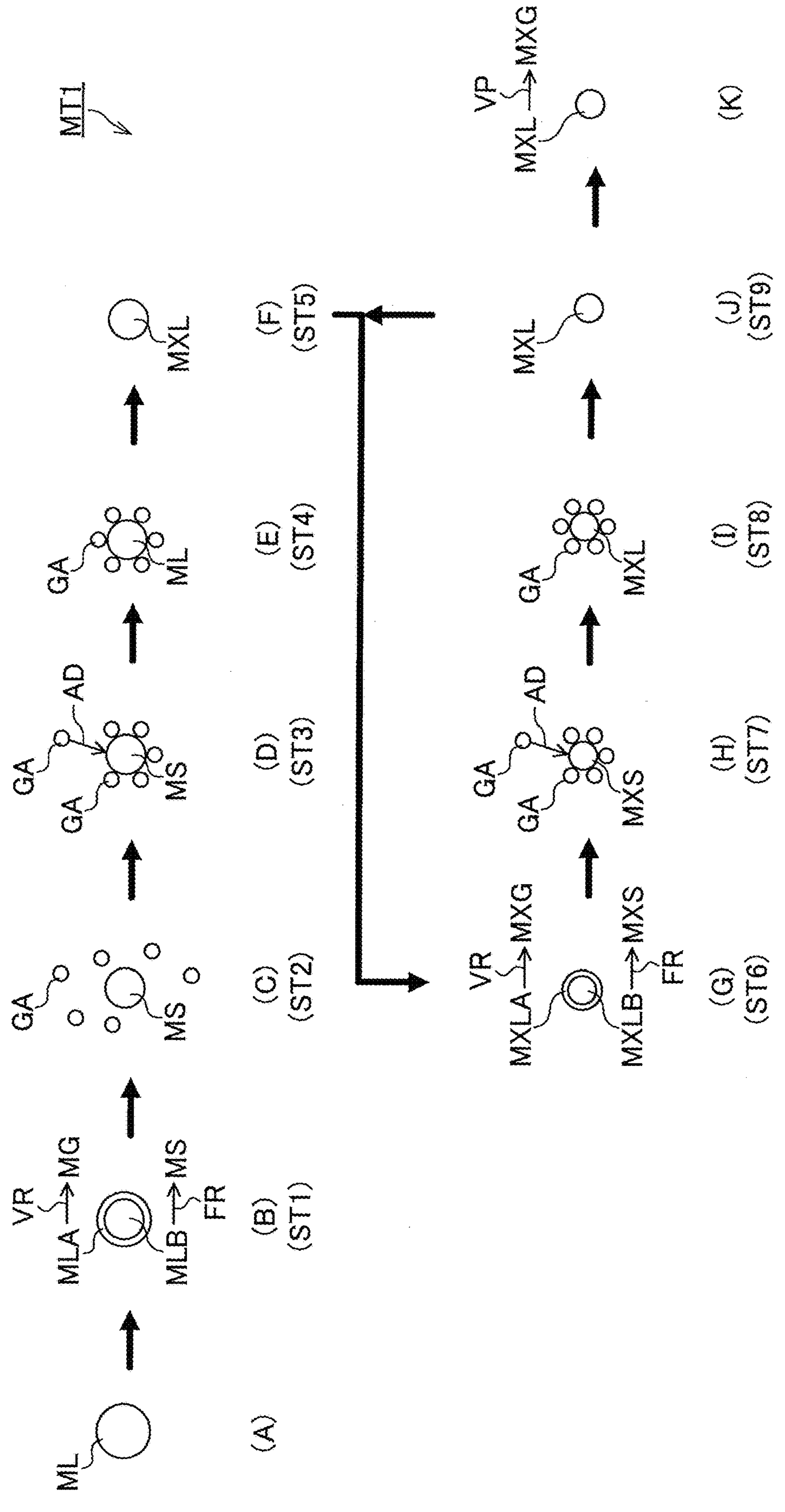
FIG. 3 is a schematic view illustrating an example of an outline of a decompression processing method according to one embodiment.

Hereinafter, steps ST1 to ST9 will be described with reference to FIGS. 3 to 9. FIG. 3 is a schematic view illustrating the outline of states of a solid moisture MS, a liquid moisture ML, or a gas moisture MG mixed into the inside of the plasma processing chamber 10 and atmospheres therearound in a case where steps ST1 to ST9 below are executed according to the present embodiment. FIGS. 4 to 9 are state diagrams illustrating the state of moisture or a mixture to be described later in each step.

In the decompression processing method MT1, in steps ST1 to ST9, the temperature may vary with a change in the pressure inside the plasma processing chamber 10; however, in the present embodiment, a temperature is controlled so that the temperature of the inside of the plasma processing chamber 10 is raised and a constant temperature is achieved. For example, for the temperature control, the controller 2 may monitor the current temperature inside the plasma processing chamber 10; in a case where the current temperature is not the above constant temperature, the controller 2 may issue a signal to the temperature control module to adjust the temperature to the above constant temperature by using the function of the temperature control module. Though the above constant temperature depends on the capacity of the function of the temperature control module to be used, a temperature range may be sufficient from a temperature slightly higher than room temperature to an upper limit temperature of a resin material such as an O-ring used for a part of the chamber. Such a temperature range may be, for example, 40° C. to 200° C.

Before the decompression processing method MT1 is executed, moisture may be mixed into the inside of the plasma processing chamber 10. This mixing may occur, for example, when the substrate W is replaced during the manufacturing process, when the inside of the plasma processing chamber 10 is opened to the atmosphere during maintenance, or when the plasma processing chamber 10 is first installed in the plasma processing apparatus 1. As a result of the mixing, the gas moisture MG is mixed into the plasma processing space 10*s* inside of the plasma processing chamber 10, and the liquid moisture ML is mixed into the part surface SF (FIG. 3(A)). The liquid moisture ML in FIG. 3 represents one liquid droplet on the part surface SF among the liquid moisture ML mixed into the inside of the plasma processing chamber 10. In the following description, though the state of the liquid moisture ML as the one liquid droplet will be described, the same applies to the other liquid droplets on the part surface SF among the liquid moisture ML mixed into the inside of the plasma processing chamber 10.

In step ST1, the inside of the plasma processing chamber 10 is vacuumed to a desired vacuum level by using the decompression unit 40. Specifically, the inside of the plasma processing chamber 10 is exhausted to a vacuum level of, for example, 1 mTorr or less, and is decompressed. The above desired vacuum level may be more preferably $1\times10^{-5}$ Torr (0.01 mTorr) or less.

According to step ST1, the gas moisture MG mixed into the inside of the plasma processing chamber 10 is removed from the plasma processing chamber 10 through the gas exhaust port 10*e*.

During the vacuuming in step ST1, a partial liquid moisture MLA in the liquid moisture ML evaporates (VR) into the gas moisture MG, and a remaining liquid moisture MLB solidifies (FR) into the solid moisture MS (FIG. 3(B)). The gas moisture MG is removed from the plasma processing chamber 10 through the gas exhaust port 10*e*. Further, the solid moisture MS remains on the part surface SF inside of the plasma processing chamber 10 even after step ST1 is executed. The details of the evaporation (VR) of the above partial liquid moisture MLA and the solidification (FR) of the above remaining liquid moisture MLB will be described later.

Next, in step ST2, the additional gas GA as an additional substance is introduced into the inside of the plasma processing chamber 10 (FIG. 3(C)). Specifically, for example, the additional gas GA is supplied from the corresponding gas source 21 of the gas supply 20 to the shower head 13 through the corresponding flow rate controller 22, and is introduced from the shower head 13 into the inside of the plasma processing chamber 10. Here, in the present embodiment, the pressure control is performed such that the inside of the plasma processing chamber 10 into which the additional gas GA is introduced has a constant pressure. Specifically, for example, the controller 2 monitors the current pressure inside of the plasma processing chamber 10. In a case where the current pressure is not the above constant pressure, a signal is issued from the controller 2 to the gas supply 20 to change the flow rate of the additional gas GA supplied from the gas supply 20. Alternatively, the controller 2 issues a signal to the decompression unit 40 to change the exhaust speed from the plasma processing chamber 10. Accordingly, the above pressure is adjusted to the above constant pressure.

Desirably, the above constant pressure is in a range, higher than a pressure such that the heat of the part surface SF is efficiently transferred to the liquid moisture ML by the introduced additional gas GA; and lower than a pressure such that the additional gas GA is condensed on the part surface SF, and is a pressure lower than a vapor pressure VP of a liquid mixture MXL formed in step ST5 to be described later. The above constant pressure may be, for example, 900 mTorr.

In step ST3, the additional gas GA introduced into the inside of the plasma processing chamber 10 in step ST2 is adsorbed (AD) to the solid moisture MS remaining on the part surface SF in step ST1 (FIG. 3(D)). The adsorption (AD) may be caused, for example, by the additional gas GA around the solid moisture MS being condensed due to the heat taken by the solid moisture MS to adhere as a liquid to the surface of the solid moisture MS. Further, for example, the adsorption (AD) may be caused by dissolving the additional gas GA around the solid moisture MS on the surface of the solid moisture MS.

Next, in step ST4, the solid moisture MS melts under the above constant temperature and the above constant pressure to turn into the liquid moisture ML (FIG. 3(E)). The details of the melting will be described later.

In step ST5, the additional gas GA thus adsorbed (AD) is mixed with the liquid moisture ML generated in step ST4, and the liquid mixture MXL of the liquid moisture ML and the additional gas GA is formed (FIG. 3(F)).

In step ST6, a partial liquid mixture MXLA in the liquid mixture MXL evaporates (VR) into a gas mixture MXG, and a remaining liquid mixture MXLB solidifies (FR) into a solid mixture MXS under the above constant temperature and the above constant pressure (FIG. 3(G)). The gas mixture MXG is removed from the plasma processing chamber 10 through the gas exhaust port 10e. Further, the solid mixture MXS remains on the part surface SF inside the plasma processing chamber 10 even after step ST6 is executed. The details of the evaporation (VR) of the above partial liquid mixture MXLA and the solidification (FR) of the above remaining liquid mixture MXLB will be described later.

Next, in step ST7, the additional gas GA is adsorbed (AD) to the remaining solid mixture MXS (FIG. 3(H)). The adsorption (AD) may be caused, for example, by the additional gas GA around the solid mixture MXS being condensed due to the heat taken by the solid mixture MXS to adhere as a liquid to the surface of the solid mixture MXS. Further, for example, the adsorption (AD) may be caused by dissolving the additional gas GA around the solid mixture MXS on the surface of the solid mixture MXS.

In step ST8, the solid mixture MXS melts under the above constant temperature and the above constant pressure to turn into the liquid mixture MXL (FIG. 3(I)).

In step ST9, the additional gas GA thus adsorbed (AD) is mixed with the liquid mixture MXL generated in step ST8 to form the liquid mixture MXL having a higher concentration of the additional gas GA (FIG. 3(J)).

Next, step ST6 is executed again under the above constant temperature and the above constant pressure, and by step ST6, a partial liquid mixture MXLA in the liquid mixture MXL evaporates (VR) into the gas mixture MXG, and a remaining liquid mixture MXLB solidifies (FR) into the solid mixture MXS (FIG. 3(G)). The gas mixture MXG is removed from the plasma processing chamber 10 through the gas exhaust port 10e. Further, the solid mixture MXS remains on the part surface SF inside the plasma processing chamber 10 even after step ST6 is executed again.

After the above-described step ST6 is executed again, the steps ST7 to ST9 are executed again successively, and thereafter, the steps ST6 to ST9 are repeated.

Due to the above repetition, the volume of the liquid mixture MXL gradually decreases, and the concentration of the additional gas GA increases. After the last step ST9 to be described later, the liquid mixture MXL entirely evaporates (VR) into the gas mixture MXG (FIG. 3(K)). The gas mixture MXG is removed from the plasma processing chamber 10 through the gas exhaust port 10e. As a result, all the liquid moisture ML is removed from the inside of the plasma processing chamber 10, and the drying of the inside of the plasma processing chamber 10 is completed.

Steps ST3 to ST9 are spontaneously progressed while the additional gas GA is introduced into the inside of the plasma processing chamber 10 and maintained at the above constant pressure in step ST2. The spontaneous progression refers to the progression of steps ST3 to ST9 without requiring any other operation and/or control.

Figure 4:
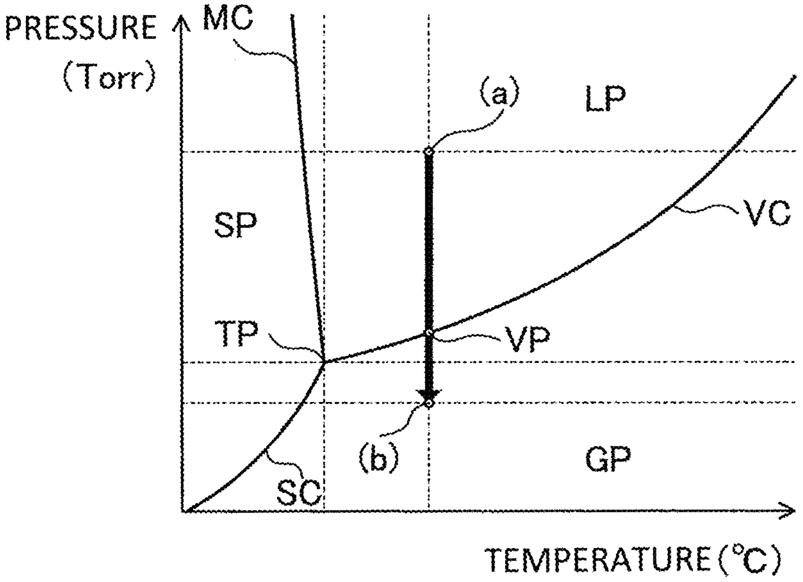
FIG. 4 is a state diagram of moisture inside a plasma processing chamber according to the embodiment.
Figure 5:
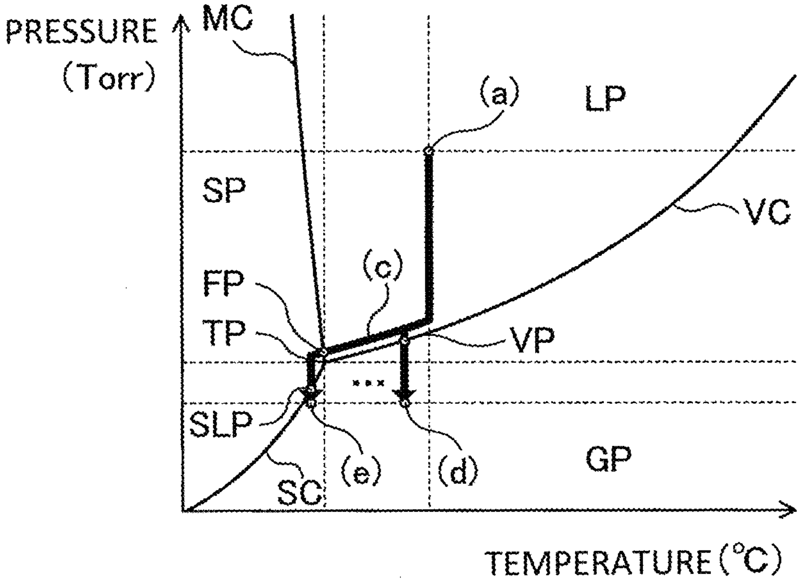
FIG. 5 is a state diagram of moisture inside the plasma processing chamber according to the embodiment.
Figure 6:
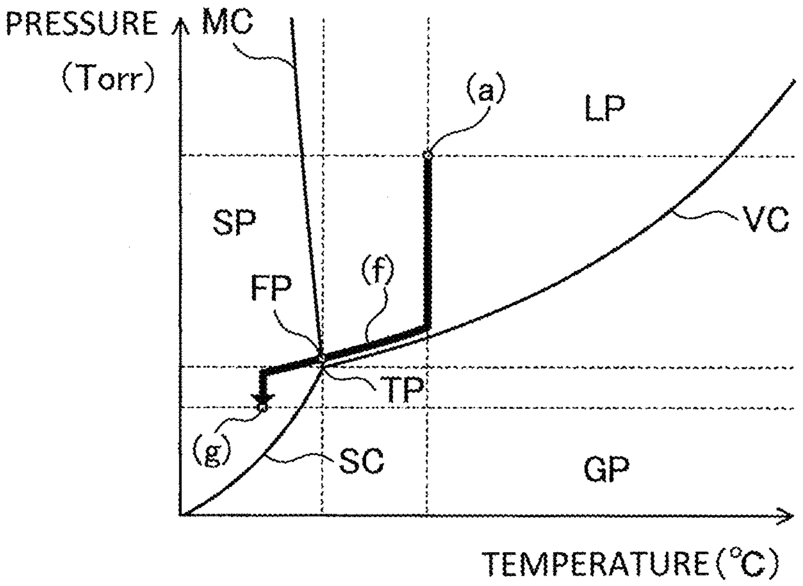
FIG. 6 is a state diagram of moisture inside the plasma processing chamber according to the embodiment.

Next, the evaporation (VR) of the above partial liquid moisture MLA and the solidification (FR) of the above remaining liquid moisture MLB in step ST1 will be described with reference to FIGS. 4 to 6. FIGS. 4 and 5 are state diagrams illustrating a state in which the above partial liquid moisture MLA can be obtained during the execution of step ST1. FIG. 6 is a state diagram illustrating a state in which the above remaining liquid moisture MLB can be obtained during the execution of step ST1.

In the state diagrams of FIGS. 4 to 6, the vertical axis represents the pressure (Torr), and the horizontal axis represents the temperature in degrees Celsius (° C.). The solid line represents the state curve of moisture or a mixture, and represents a sublimation curve SC, a melting curve MC, and a vapor pressure curve VC. The state curves intersect at a triple point TP. The region surrounded by the sublimation curve SC and the melting curve MC, that is, the moisture or the mixture contained in a solid phase SP, forms the solid moisture MS or the solid mixture MXS. The region surrounded by the melting curve MC and the vapor pressure curve VC, that is, the moisture or the mixture contained in a liquid phase LP forms the liquid moisture ML or the liquid mixture MXL. The region surrounded by the vapor pressure curve VC and the sublimation curve SC, that is, the moisture or the mixture contained in a gas phase GP, forms the gas moisture MG or the gas mixture MXG. A bold arrow is a trajectory representing a transition of the state of the moisture or the mixture to be focused. For example, the pressure and temperature at a certain point on the bold arrow indicate the pressure and temperature of the moisture or the mixture to be focused at that point. The same applies to FIGS. 7 to 9 and FIGS. 11 to 13 to be described later.

First, the state of the above partial liquid moisture MLA will be described. In FIG. 4, the above partial liquid moisture MLA is in the state illustrated in (a) of FIG. 4 before the vacuuming in step ST1 is started. When the vacuuming is started in step ST1, the above partial liquid moisture MLA decreases in the pressure along the bold arrow in FIG. 4 and evaporates (VR) at the vapor pressure VP, resulting in the state illustrated in (b) of FIG. 4, that is, the gas moisture MG, at the pressure when the vacuuming is completed.

Here, when the above partial liquid moisture MLA evaporates (VR), the temperature of the above partial liquid moisture MLA itself decreases because the heat of evaporation is taken from the above partial liquid moisture MLA itself. While the above partial liquid moisture MLA continues to evaporate (VR), the temperature of the above partial liquid moisture MLA itself continues to decrease. FIG. 5 illustrates the state of the above partial liquid moisture ML in this case, and the temperature continues to decrease in the state (c) of FIG. 5. Thereafter, with decrease in the pressure, the above partial liquid moisture MLA having a decreased temperature as stated above also successively evaporates (VR) at the vapor pressure VP. At the pressure when the vacuuming is completed, the state illustrated in (d) of FIG. 5, that is, the gas moisture MG is obtained.

The above partial liquid moisture MLA continues to decrease in temperature, and a part thereof exists that solidifies (FR) into the solid moisture MS at a solidification point FP. A portion turned into the solid moisture MS of the above partial liquid moisture MLA is then sublimated at a sublimation pressure SLP with decrease in the pressure. Also with respect to the above-described part, the state illustrated in (e) of FIG. 5, that is, the gas moisture MG, is obtained at the pressure when the vacuuming is completed.

Next, the state of the above remaining liquid moisture MLB will be described. In FIG. 6, the above remaining liquid moisture MLB is in the state illustrated in (a) of FIG. 6 before the vacuuming is started in step ST1. When the vacuuming is started in step ST1, the pressure of the above remaining liquid moisture MLB decreases along the bold arrow in FIG. 6.

Here, when the above partial liquid moisture MLA evaporates (VR) as stated above, the temperature of the above remaining liquid moisture MLB decreases because the heat of evaporation is taken from the above remaining liquid moisture MLB. While the above partial liquid moisture MLA continues to evaporate (VR), the temperature of the above remaining liquid moisture MLB continues to decrease (the state (f) of FIG. 6).

Thereafter, the ratio of the above partial liquid moisture MLA that evaporates (VR) gradually decreases with decrease in the pressure due to the vacuuming, and the ratio of the above remaining liquid moisture MLB that solidifies (FR) increases. When the above partial liquid moisture MLA entirely evaporates (VR) and the above remaining liquid moisture MLB entirely solidifies (FR), the temperature of the above remaining liquid moisture MLB ceases to decrease. At the pressure when the vacuuming is completed, the above remaining liquid moisture MLB is in the state illustrated in (g) of FIG. 6, that is, the solid moisture MS.

Since the liquid moisture ML is made uniform by constantly mixing water molecules in different states by molecular motion, strictly speaking, the above partial liquid moisture MLA and the above remaining liquid moisture MLB are not distinguished. Therefore, in the present embodiment, for the sake of convenience, paradoxically, the liquid moisture ML that reaches the state (b) of FIGS. 4 and 5 and becomes the gas moisture MG when the vacuuming is completed is defined as the above partial liquid moisture MLA, and the liquid moisture ML that reaches the state (g) of FIG. 6 and becomes the solid moisture MS when the vacuuming is completed is defined as the above remaining liquid moisture MLB.

Further, since the plasma processing chamber 10 is maintained at the above constant temperature as described above, the temperature of the liquid moisture ML that adheres to the part surface SF inside the plasma processing chamber 10 increases due to the heat input from the part surface. However, in the present embodiment, the rate of increase in temperature due to the heat input is sufficiently small compared to the rate of decrease in temperature in a case where heat is taken as the heat of evaporation by the above evaporation (VR), and thus, the increase in temperature due to the above heat input is not considered to be omitted in the above description.

Figure 7:
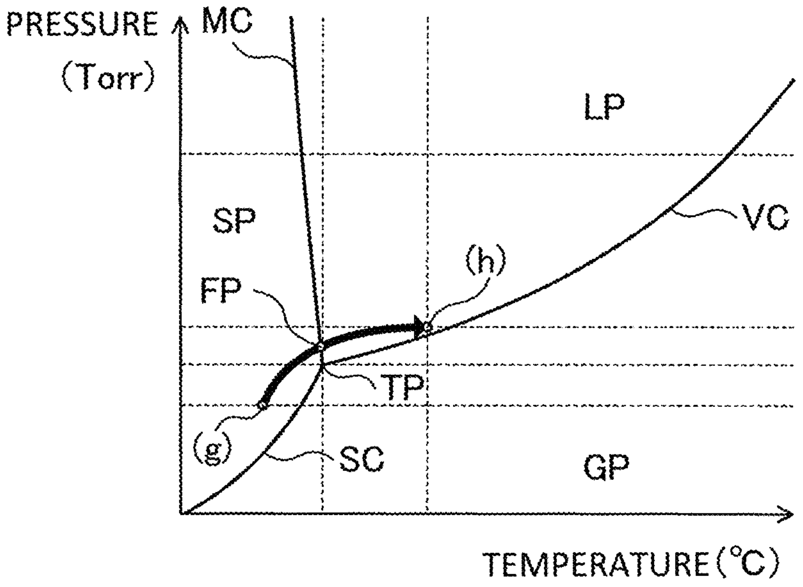
FIG. 7 is a state diagram of moisture inside the plasma processing chamber according to the embodiment.
Figure 8:
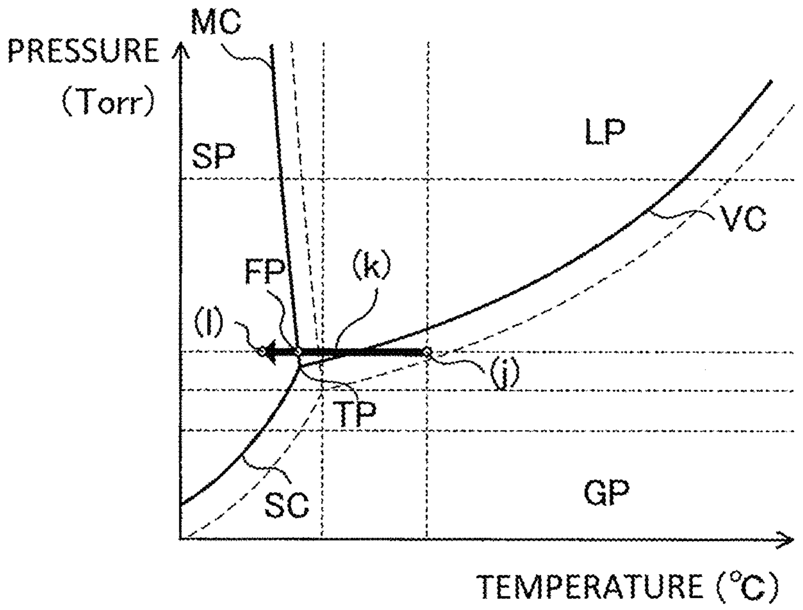
FIG. 8 is a state diagram of a mixture inside the plasma processing chamber according to the embodiment.
Figure 9:
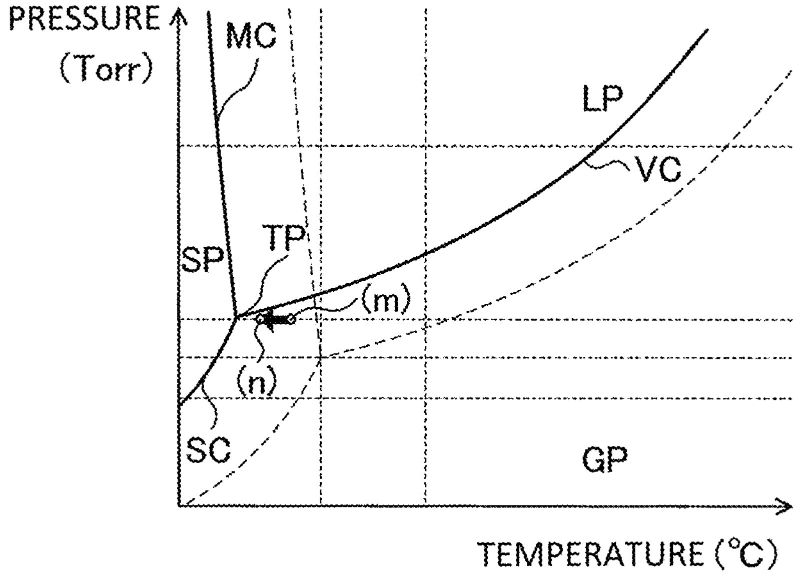
FIG. 9 is a state diagram of the mixture inside the plasma processing chamber according to the embodiment.

Next, the state of the above solid moisture and the above liquid mixture MXL during the execution of steps ST2 to ST9 will be described with reference to FIGS. 7 to 9. FIG. 7 is a state diagram illustrating a state in which the solid moisture MS can be obtained when the additional gas is introduced in step ST2 and the pressure inside the plasma processing chamber 10 is adjusted to become the above constant pressure. FIG. 8 is a state diagram illustrating a state in which a mixture may be obtained in step ST6, and FIG. 9 is a state diagram illustrating a state in which a mixture may be obtained in a case where the liquid mixtures MXL entirely evaporates (VR) after steps ST6 to ST9 are repeated.

As described above, the solid moisture MS remaining after the vacuuming in step ST1 melts to turn into the liquid moisture ML in step ST4. Specifically, in FIG. 7, the additional gas GA is introduced in step ST2 to raise the pressure to the above constant pressure, and at the same time, the pressure increases to the above constant temperature by the heat input from the above part surface SF (bold arrow in FIG. 7). With the increase in the pressure and the temperature, the solid moisture MS melts at the solidification point FP to become a state illustrated in (h) of FIG. 7, that is, the liquid moisture ML.

Thereafter, the additional gas GA is mixed with the liquid moisture ML in the state (h) of FIG. 7 in step ST5, and the liquid mixture MXL is formed.

In FIG. 8, the solid line represents the state curve of the mixture formed in step ST5, and the broken line represents the state curve of moisture in a case where the additional gas GA is not mixed. In the liquid mixture MXL in which the additional gas GA according to the present embodiment is mixed, the temperature of the boiling point and the temperature of the solidification point FP under the constant pressure condition decrease compared to the moisture in a case where the additional gas GA is not mixed. Therefore, the state curve of the mixture illustrated by the solid line in FIG. 8 shifts leftward than the state curve of the moisture in a case where the additional gas GA illustrated by the broken line is not mixed. The state (j) of FIG. 8 immediately after the liquid mixture MXL is obtained in step ST5 has the same temperature and pressure as the state (h) of FIG. 7 immediately after the liquid mixture MXL melts in step ST4.

As a result of the shift of the state curve of the mixture as described above, the vapor pressure VP of the liquid mixture MXL becomes higher than the vapor pressure VP of the liquid moisture ML. Further, since the above constant pressure in the present embodiment is set to be the pressure lower than the vapor pressure VP of the liquid mixture MXL as described above, the mixture in the state (j) of FIG. 8 is included in the gas phase GP. Therefore, in step ST6, the above partial liquid mixture MXLA evaporates (VR) into the gas mixture MXG.

In order to set the above constant pressure in the present embodiment, a value obtained in advance may be used as the vapor pressure VP of the liquid mixture MXL. That is, for example, calculations or experiments may be performed with respect to the liquid mixture MXL for each type of the additional gas GA, a theoretical value or an actual measurement value of the vapor pressure VP may be obtained in advance, and the above constant pressure may be set by using the theoretical value or the actual measurement value as the vapor pressure VP of the liquid mixture MXL.

Further, when the partial liquid mixture MXLA evaporates (VR) in step ST6, the temperature of the above remaining liquid mixture MXLB decreases because the heat of evaporation is taken from the remaining liquid mixture MXLB. While the above partial liquid mixture MXLA continues to evaporate (VR), the temperature of the above remaining liquid mixture MXLB continues to decrease (state (k) of FIG. 8). When the temperature of the above remaining liquid mixture MXLB falls below the solidification point FP, the above remaining liquid mixture MXLB solidifies (FR) into the state illustrated in (l) of FIG. 8, that is, the solid mixture MXS.

As described above, steps ST6 to ST9 are repeated on the liquid mixture MXL, and the volume of the liquid mixture MXL gradually decreases, and the concentration of the additional gas GA increases. Due to the above repetition, the state curve of the mixture further shifts leftward as the concentration of the additional gas GA increases.

In FIG. 9, it is assumed that the liquid mixture MXL in the state illustrated in (m) of FIG. 9 is formed in step ST9 after the above repetition. As a result of the shift of the state curve of the mixture due to the above repetition, the liquid mixture MXL in the state (m) of FIG. 9 is included in the gas phase GP. Therefore, the liquid mixture MXL in the state (m) of FIG. 9 evaporates (VR) into the gas mixture MXG. At this time, even if the liquid mixture MXL in the state (m) of FIG. 9 entirely evaporates (VR) and the temperature decreases to the state (n) of FIG. 9 due to the heat of evaporation thereof, the mixture in the state (n) of FIG. 9 does not reach the solidification point FP of the mixture, and does not solidify (FR). Therefore, after step ST9 after the above repetition, the liquid mixture MXL entirely evaporates (VR) into the gas mixture MXG.

Second Embodiment

Next, a decompression processing method MT2 for the plasma processing apparatus 1 according to a second embodiment will be described.

In a decompression processing method MT2 of the present embodiment, the inside of the plasma processing chamber 10 is dried by successively executing steps ST20 to ST29 described below.

Figure 10:
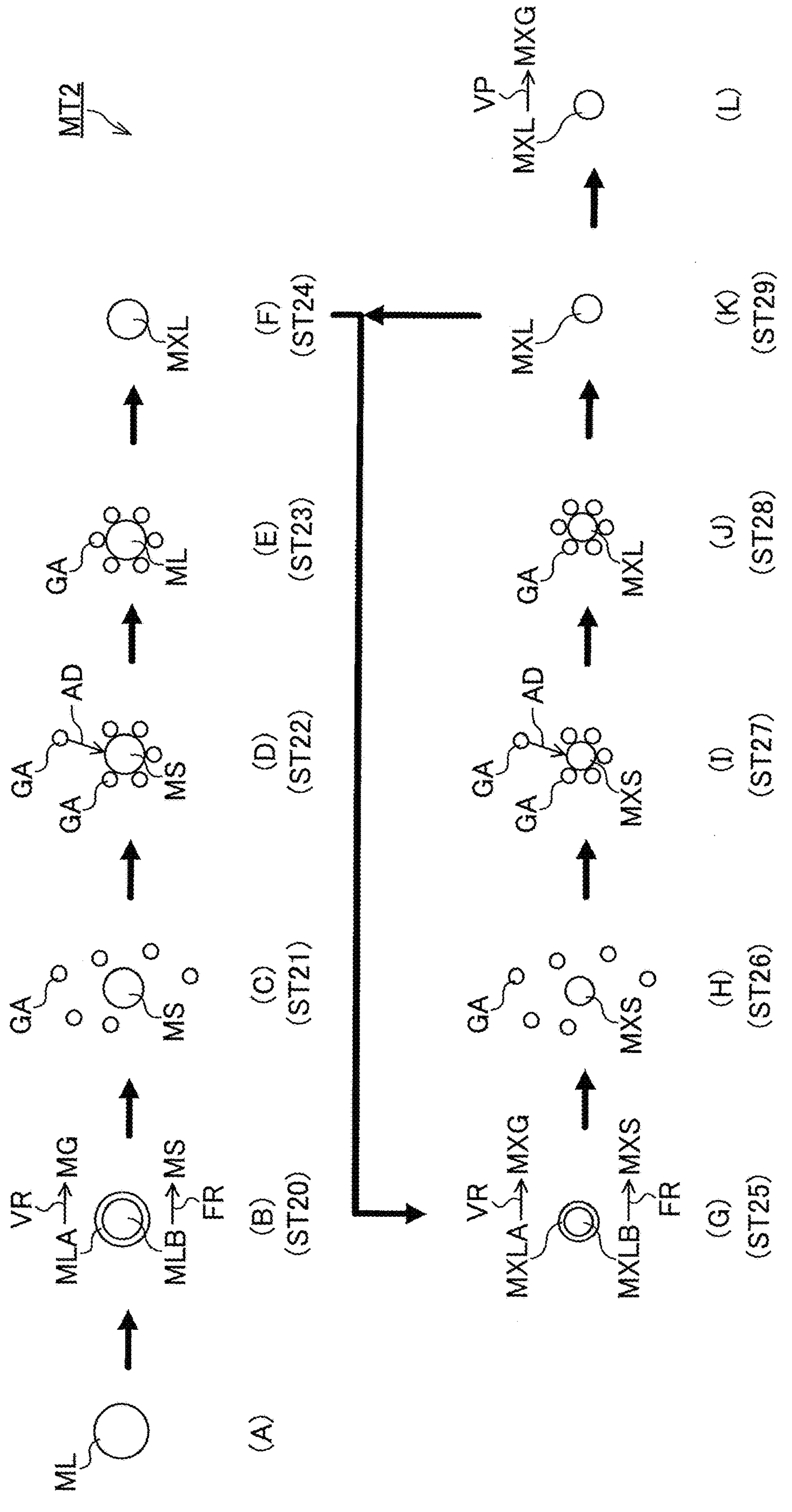
FIG. 10 is a schematic view illustrating an example of an outline of a decompression processing method according to another embodiment.
Figure 11:
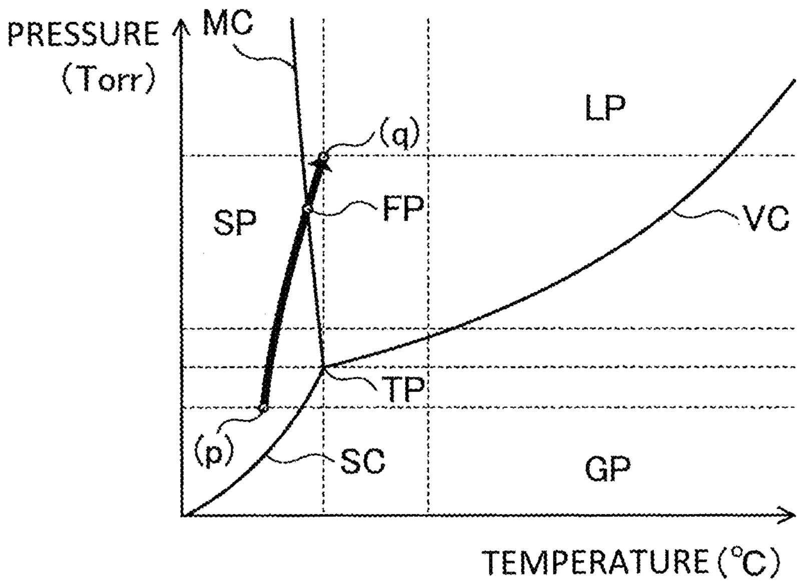
FIG. 11 is a state diagram of moisture inside a plasma processing chamber according to another embodiment.
Figure 12:
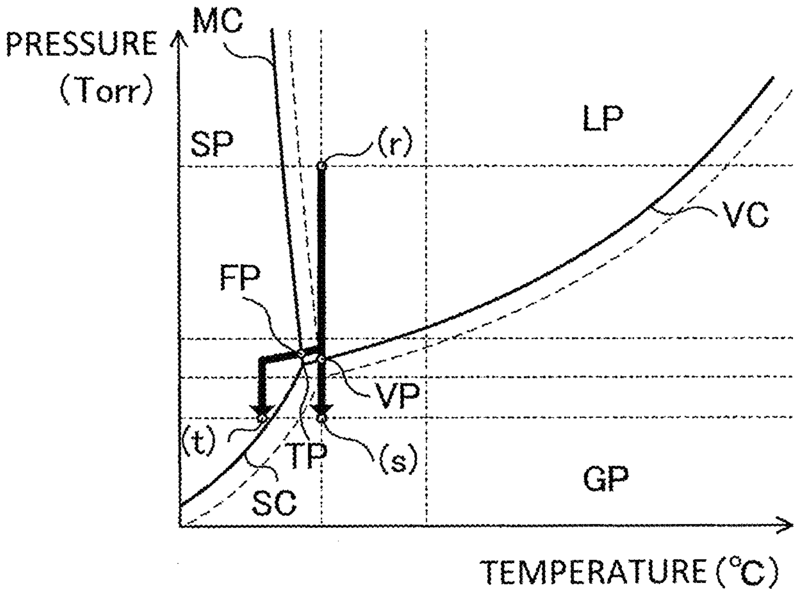
FIG. 12 is a state diagram of a mixture inside the plasma processing chamber according to another embodiment.
Figure 13:
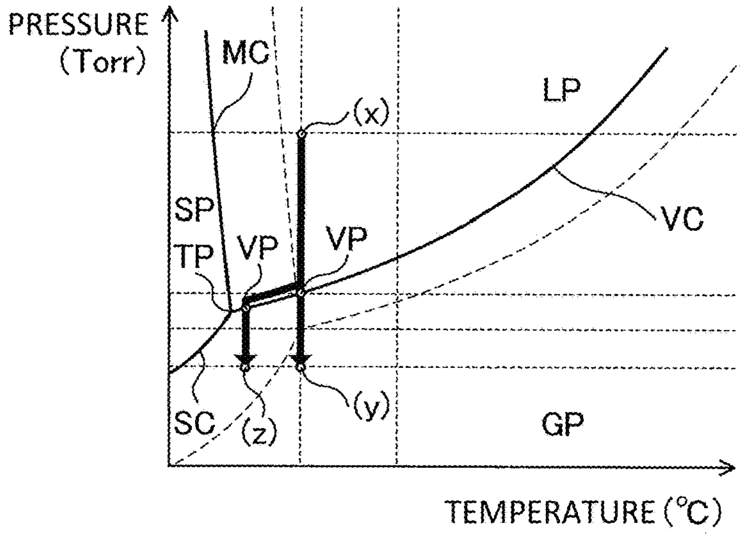
FIG. 13 is a state diagram of the mixture inside the plasma processing chamber according to another embodiment.

Hereinafter, steps ST20 to ST29 will be described with reference to FIGS. 10 to 13. FIG. 10 is a schematic view illustrating the outline of a state of the solid moisture MS, the liquid moisture ML, or the gas moisture MG mixed into the inside of the plasma processing chamber 10 in a case where steps ST20 to ST29 described below according to the present embodiment are executed. FIGS. 11 to 13 are state diagrams illustrating the state of moisture or a mixture to be described later in each step.

Similar to the decompression processing method MT1 for the first embodiment, moisture may be mixed into the inside of the plasma processing chamber 10 before the decompression processing method MT2 is executed. As a result of the mixing, the gas moisture MG is mixed into the plasma processing space 10*s* inside of the plasma processing chamber 10, and the liquid moisture ML is mixed into the part surface SF (FIG. 10(A)).

In step ST20, the inside of the plasma processing chamber 10 is vacuumed to a desired vacuum level by using the decompression unit 40. Specifically, the inside of the plasma processing chamber 10 is exhausted to a vacuum level of, for example, 1 mTorr or less, and is decompressed. After the vacuuming to the desired vacuum level is completed, the vacuuming from the plasma processing chamber 10 by the decompression unit 40 is stopped. The above desired vacuum level may be more preferably $1\times10^{-5}$ Torr (0.01 mTorr) or less.

According to step ST20, the gas moisture MG mixed into the inside of the plasma processing chamber 10 is removed from the plasma processing chamber 10 through the gas exhaust port 10*e*.

In step ST20, a partial liquid moisture MLA in the liquid moisture ML evaporates (VR) into the gas moisture MG, and the remaining liquid moisture MLB solidifies (FR) into the solid moisture MS (FIG. 10(B)). The gas moisture MG is removed from the plasma processing chamber 10 through the gas exhaust port 10*e*. Further, the solid moisture MS remains on the part surface SF inside of the plasma processing chamber 10 even after step ST20 is executed. Details of the evaporation (VR) of the above partial liquid moisture MLA and the solidification (FR) of the above remaining liquid moisture MLB are the same as those described with reference to FIGS. 4 to 6 according to the first embodiment, and thus descriptions thereof will be omitted.

In step ST21, the additional gas GA as an additional substance is then introduced into the inside of the plasma processing chamber 10 (FIG. 10(C)). Specifically, for example, the additional gas GA is supplied from the corresponding gas source 21 of the gas supply 20 to the shower head 13 through the corresponding flow rate controller 22, and is introduced from the shower head 13 into the inside of the plasma processing chamber 10. Here, in the present embodiment, the pressure control is performed such that the inside of the plasma processing chamber 10 into which the additional gas GA is introduced has a constant pressure. Specifically, for example, the controller 2 monitors the current pressure inside of the plasma processing chamber 10. When the current pressure is not the above constant pressure, a signal is issued from the controller 2 to the gas supply 20, and the pressure is adjusted to the above constant pressure by changing the flow rate of the additional gas GA supplied from the gas supply 20.

Desirably, the above constant pressure is in a range: higher than a pressure such that the heat of the part surface SF is efficiently transferred to the liquid moisture ML by the introduced additional gas GA and a pressure such that the solid moisture MS and the solid mixture MXS formed in step ST25 to be described later melt; and lower than a pressure such that the additional gas GA is condensed on the part surface SF. The above constant pressure may be, for example, atmospheric pressure; however, when the pressure becomes equal to or higher than the atmospheric pressure, the inside of the plasma processing chamber 10 may be opened to the atmosphere, and moisture in the atmosphere may be mixed again, and thus it is desirable to decrease the pressure below the atmospheric pressure.

In step ST22, the additional gas GA introduced into the inside of the plasma processing chamber 10 in step ST21 is adsorbed (AD) by the solid moisture MS remaining in step ST20 (FIG. 10(D)). The adsorption (AD) may be caused, for example, by the additional gas GA around the solid moisture MS being condensed due to the heat taken by the solid moisture MS to adhere as a liquid to the surface of the solid moisture MS. Further, for example, the adsorption (AD) may be caused by dissolving the additional gas GA around the solid moisture MS on the surface of the solid moisture MS.

Next, in step ST23, the solid moisture MS melts under the above constant pressure to turn into the liquid moisture ML (FIG. 10(E)). The details of the melting will be described later.

In step ST24, the additional gas GA thus adsorbed (AD) is mixed with the liquid moisture ML generated in step ST23, and the liquid mixture MXL of the liquid moisture ML and the additional gas GA is formed ((F) of FIG. 10).

In step ST25, the inside of the plasma processing chamber 10 is vacuumed to a desired vacuum level again by using the decompression unit 40. In the vacuuming in step ST25, the inside of the plasma processing chamber 10 is exhausted to a pressure lower than the vapor pressure VP of at least the liquid mixture MXLA to be described later to be decompressed. Specifically, for example, the pressure may be decreased to achieve the same vacuum level as that in step ST20. Further, after the vacuuming to the above desired vacuum level is completed, the vacuuming from the plasma processing chamber 10 by the decompression unit 40 is stopped.

During the execution of step ST25, a partial liquid mixture MXLA in the liquid mixture MXL evaporates (VR) into the gas mixture MXG, and a remaining liquid mixture MXLB solidifies (FR) into the solid mixture MXS (FIG. 10(G)). The gas mixture MXG is removed from the plasma processing chamber 10 through the gas exhaust port 10*e*. Further, the solid mixture MXS remains on the part surface SF inside of the plasma processing chamber 10 even after step ST25 is executed.

The details of the evaporation (VR) of the above partial liquid mixture MXLA and the solidification (FR) of the above remaining liquid mixture MXLB will be described later.

In step ST26, the additional gas GA is again introduced into the inside of the plasma processing chamber 10 (FIG. 10(H)). In step ST26, the additional gas GA is introduced to the above constant pressure in the same manner as in step ST21.

In step ST27, the additional gas GA introduced into the inside of the plasma processing chamber 10 in step ST26 is adsorbed (AD) to the remaining solid mixture MXS (FIG. 10(I)). The adsorption (AD) may be caused, for example, by the additional gas GA around the solid mixture MXS being condensed due to the heat taken by the solid mixture MXS to adhere as a liquid to the surface of the solid mixture MXS. Further, for example, the adsorption (AD) may be caused by dissolving the additional gas GA around the solid mixture MXS on the surface of the solid mixture MXS.

In step ST28, the solid mixture MXS melts under the above constant pressure to turn into the liquid mixture MXL ((J) of FIG. 10).

In step ST29, the additional gas GA thus adsorbed (AD) is mixed with the liquid mixture MXL generated in step ST28 to form the liquid mixture MXL having a higher concentration of the additional gas GA ((K) of FIG. 10).

After step ST29, step ST25 is executed again, and the inside of the plasma processing chamber 10 is vacuumed to a desired vacuum level by using the decompression unit 40. That is, after step ST29, steps ST25 to ST29 are repeated. In another aspect, in the decompression processing method MT2 according to the second embodiment, the steps of supplying the additional gas GA and the vacuuming are alternately repeated.

Due to the above repetition, the volume of the liquid mixture MXL gradually decreases, and the concentration of the additional gas GA increases. After step ST29 after the above repetition, the liquid mixture MXL entirely evaporates (VR) to turn into the gas mixture MXG (FIG. 10(L)). The gas mixture MXG is removed from the plasma processing chamber 10 through the gas exhaust port 10*e*. As a result, all the liquid moisture ML is removed from the inside of the plasma processing chamber 10, and the drying of the inside of the plasma processing chamber 10 is completed.

Next, the state of the moisture and the mixture during the execution of the decompression processing method MT2 will be described with reference to FIGS. 11 to 13. FIG. 11 is a state diagram illustrating a state in which the solid moisture MS can be obtained when the additional gas GA is introduced to achieve the above constant pressure in step ST21. FIG. 12 is a state diagram illustrating a state in which a mixture can be obtained in step ST25 again, and FIG. 13 is a state diagram illustrating a state in which a mixture can be obtained in a case where the liquid mixtures MXL entirely evaporates (VR) after step ST29 after the above repetition.

As described above, the solid moisture MS remaining after the vacuuming in step ST20 melts in step ST23 to turn into the liquid moisture ML. Specifically, in FIG. 11, the additional gas GA is introduced in step ST21 from the state (p) illustrating the state of the solid moisture MS remaining after the vacuuming in step ST20, and the pressure increases to the above constant pressure. Since the above constant pressure in the present embodiment is set to be higher than the pressure at which the solid moisture MS melts as described above, the solid moisture MS melts at the pressure of the solidification point FP. Further, the temperature slightly increases due to latent heat such as the melting or the condensation of the gas moisture MG. As a result, the solid moisture MS becomes the state illustrated in (q) of FIG. 11, that is, the liquid moisture ML.

In order to set the above constant pressure in the present embodiment, as the pressure at which the solid moisture MS and the solid mixture MXS formed in step ST25 to be described later melt, for example, a theoretical value or an actual measurement value obtained in advance through calculations or experiments may be used for each type of the additional gas GA.

Thereafter, the additional gas GA is mixed with the liquid moisture ML in the state (q) of FIG. 11 in step ST24, and the liquid mixture MXL is formed.

In FIG. 12, the solid line represents the state curve of the mixture formed in step ST24, and the broken line represents the state curve of moisture in a case where the additional gas GA is not mixed. In the liquid mixture MXL in which the additional gas GA is mixed, the vapor pressure VP under the constant temperature condition increases and the pressure of the solidification point FP decreases compared to the moisture in a case where the additional gas GA is not mixed. Therefore, the state curve of the mixture illustrated by the solid line in FIG. 12 shifts leftward than the state curve of the moisture in a case where the additional gas GA illustrated by the broken line is not mixed.

Here, the state (r) of FIG. 12 immediately after the liquid mixture MXL is obtained in step ST24 has the same temperature and pressure as the state (q) of FIG. 11 immediately after the liquid mixture MXL melts in step ST23. When step ST25 is started in this state, the above partial liquid moisture MLA decreases in the pressure along the bold arrow in FIG. 12, and evaporates (VR) at the vapor pressure VP to become the state illustrated in (s) of FIG. 12, that is, the gas moisture MG, at the pressure when step ST25 is completed.

Here, in step ST25, when the above partial liquid mixture MXLA evaporates (VR) as stated above, the temperature of the above remaining liquid mixture MXLB decreases because the heat of evaporation is taken from the above remaining liquid moisture MLB. While the above partial liquid mixture MXLA continues to evaporate (VR), the temperature of the above remaining liquid mixture MXLB continues to decrease. When the temperature of the above remaining liquid mixture MXLB falls below the solidification point FP, the above remaining liquid mixture MXLB solidifies (FR) into the state illustrated in (t) of FIG. 12, that is, the solid mixture MXS.

Steps ST26 to ST29 are repeated on the solid mixture MXS illustrated in the state (t) of FIG. 12, as described above. Accordingly, the volume of the liquid mixture MXL gradually decreases, and the concentration of the additional gas GA increases. Due to the above repetition, the state curve of the mixture further shifts leftward as the concentration of the additional gas GA increases.

In FIG. 13, it is assumed that the liquid mixture MXL in the state illustrated in (x) of FIG. 13 is formed in step ST29 after the above repetition. When step ST25 is executed on the liquid mixture MXL in the state (x) of FIG. 13, the liquid mixture MXL evaporates (VR) at the vapor pressure VP to become the state illustrated in (y) of FIG. 13, that is, the gas mixture MXG. At this time, the temperature of the liquid mixture MXL decreases because the heat of evaporation is taken from the liquid mixture MXL itself. However, as a result of the shift of the state curve of the mixture due to the above repetition, the temperature of the liquid mixture MXL does not fall below the solidification point FP. Therefore, the liquid mixture MXL whose temperature has decreased also successively evaporates (VR) at the vapor pressure VP, and the liquid mixture MXL whose temperature has decreased the most becomes the state illustrated in (z) of FIG. 13, that is, the gas mixture MXG.

Here, additional substances that can be used as the additional gas GA in the first and second embodiments will be described.

The additional gas GA may be any substance that can be mixed with moisture, and that causes the state curve of a mixture formed by being mixed with moisture to shift and more easily evaporates (VR) than moisture. In Table 1 below, these substances are evaluated for suitability as the additional gas GA.

exhibits a certain degree of suitability as the suitability C. Though the substances other than the above are applicable as the suitability D, the suitability thereof was inferior to the suitability A to C. Therefore, as the additional gas GA of the present embodiment, it is particularly preferable to apply ammonia that is a substance of the suitability A, then preferable to apply alcohol that is a substance of the suitability B, and then preferable to apply carbon dioxide that is a substance of the suitability C.

As the method for introducing the additional substance, in the present embodiment, the additional gas is introduced as the additional gas GA from the gas supply 20 through the gas introduction unit; however, the present disclosure is not

TABLE 1

| SUBSTANCE | SOLUBILITY IN WATER (0° C., $cm^3$/($H_2O$ $cm^3$)) | SOLUBILITY IN WATER (20° C., $cm^3$/($H_2O$ $cm^3$)) | SOLIDIFICATION POINT (° C.) | BOILING POINT (° C.) | AZEOTROPIC POINT (° C.) | SUITABILITY |
|---|---|---|---|---|---|---|
| $N_2$ | 0.024 | 0.016 | −209.86 | −195.8 | — | D |
| $O_2$ | 0.049 | 0.031 | −218.4 | −183 | — | D |
| $CO_2$ | 1.71 | 0.88 | −56.6 | −78.5 (SUBLIMATION) | — | C |
| $NH_3$ | 1176 | 702 | −77.73 | −33.4 | — | A |
| AMMONIA WATER (25 wt %) | — | — | −57.5 | 37.7 | — | A |
| AMMONIA WATER (32 wt %) | — | — | −91.5 | 24.7 | — | A |
| ETHANOL | — | — | −114.14 | 78.29 | 78.2° C. AT 96% | B |
| 1-PROPANOL | — | — | −126.5 | 97.15 | 87.7° C. AT 71.7% | B |
| 2-PROPANOL | — | — | −89.5 | 82.4 | 80.1° C. AT 88% | B |
| Ar | 0.053 | 0.035 | −189.2 | −185.8 | — | D |
| He | 0.0093 | 0.0088 | −271.39 | −268.9 | — | D |
| H2 | 0.022 | 0.018 | −259.2 | −252.9 | | D |
| Kr | — | — | −157.36 | −153.22 | — | D |
| $C_4F_8$ | — | 23.6 (25° C., mg/L) | −41.4 | −6.04 | — | D |
| $C_4F_6$ | — | — | −130 | 5.5 | — | D |
| $CH_2F_2$ | — | 0.44 (25° C., g/100 g) | −136 | −51.6 | — | D |
| $C_3F_8$ | — | — | −183 | −36.7 | — | D |
| $CH_4$ | 0.056 | 0.033 | −182.5 | −161.6 | — | D |
| $CF_4$ | — | — | −183.6 | −127.8 | — | D |

In Table 1, examples of the gas that can be introduced into the inside of the plasma processing chamber 10, and the solubility in water, solidification point, boiling point, and azeotropic point of these are illustrated in the plasma processing apparatus 1 according to the present embodiment. For a suitability evaluation, suitability A means that the substance is most suitable as the additional gas GA; suitability B means to be suitable next to the suitability A; suitability C means to be suitable next to the suitability B; and suitability D means that though the substance is applicable, it is less suitable than the substances of the suitability A to C.

In the suitability evaluation, the suitability can be determined mainly in consideration of the solubility in water, and each degree of decrease in the boiling point, solidification point, and azeotropic point in a case where a substance is dissolved.

In the present embodiment, ammonia (NH3) and its aqueous solution exhibits high suitability as the suitability A. and then ethanol and propanol that are alcohols exhibit high suitability as the suitability B to be second only to ammonia and the like. In addition, carbon dioxide (CO2)

limited thereto. If the additional substance can be uniformly introduced into the inside of the plasma processing chamber 10, a mixture can be formed even if the additional substance is introduced in the state of liquid droplets such as an aerosol (mist).

Incidentally, according to the present disclosure, for example, when the additional substance is introduced to form the mixture even without performing the above-described vacuuming, it is possible to shorten the time required for drying the inside of the plasma processing chamber 10. However, it is preferable to introduce the additional gas GA in a state in which the vacuuming is executed as in the embodiment. Hereinafter, the significance of the above-described vacuuming, that is, step ST1 according to the first embodiment, and steps ST20 and ST25 according to the second embodiment will be described in detail with reference to FIGS. 14 to 16.

Figure 14:
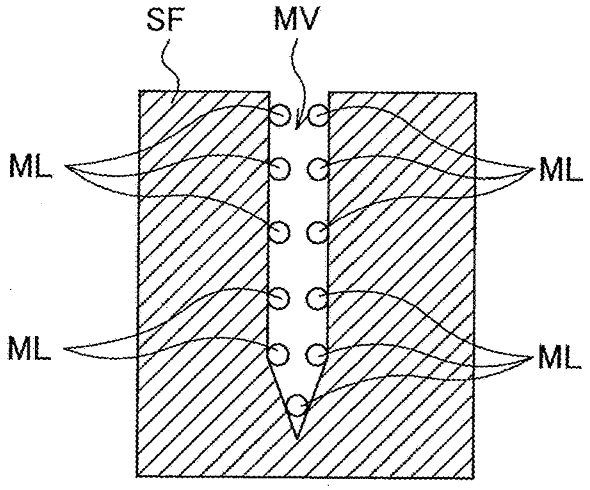
FIG. 14 is a schematic view illustrating an outline of a part surface inside the plasma processing apparatus according to the present embodiment.

In FIG. 14, a micro void MV may be formed on the part surface SF such as anodized aluminum inside the plasma processing chamber 10 according to the present embodiment. In a case where moisture is mixed into the inside of the plasma processing chamber 10, the liquid moisture ML may enter the microvoid MV by a capillary phenomenon.

Here, in a case where an alcohol AH, for instance, is applied as the additional substance without execution of the above vacuuming, it may be conceivable to form the mixture, for example, by means of wiping with the alcohol a part immediately before installation or immersing the part in the alcohol AH in advance. However, since the liquid moisture ML and the alcohol AH have different degrees in easiness of entering the microvoid MV due to the capillary phenomenon, and the alcohol is hard to enter there, the alcohol AH cannot reach a deeper portion of the microvoid MV, and a mixture cannot be formed in the deeper portion of the microvoid MV.

Hereinafter, the easiness of entering the microvoids MV due to the capillary phenomenon will be described in detail. In a case where a liquid such as the liquid moisture ML or the alcohol AH enters the microvoid MV due to the capillary phenomenon, the easiness of the liquid entering can be estimated by obtaining a liquid level height h based on the following Equation (1).

$$h=2T\times\cos\theta(\rho\times g\times r) \quad (1)$$

In Equation (1), h is the liquid level height of the liquid entering the microvoid MV, T is the surface tension of the liquid, θ is the contact angle of the liquid, ρ is the density of the liquid, g is the gravitational acceleration, and r is the inner diameter of the microvoid MV.

Figure 15:
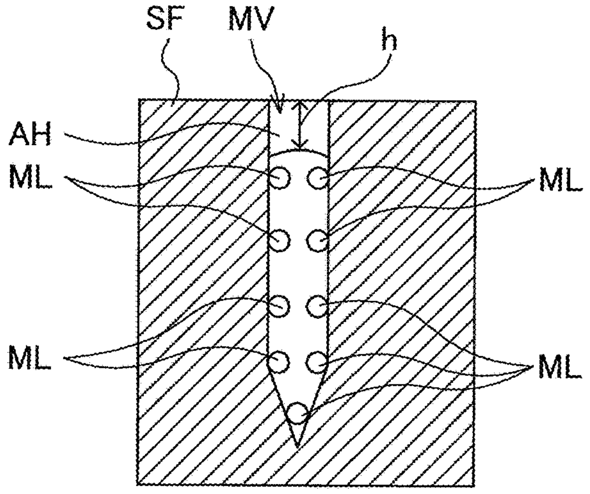
FIG. 15 is a schematic view illustrating an outline of the part surface inside the plasma processing apparatus according to the present embodiment.
Figure 16:
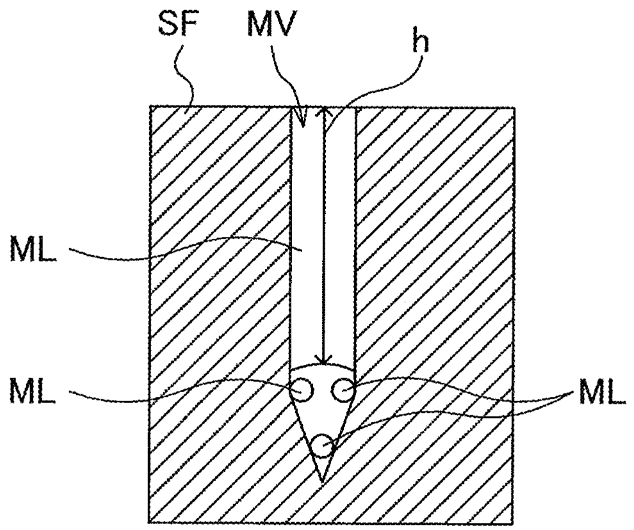
FIG. 16 is a schematic view illustrating an outline of the part surface inside the plasma processing apparatus according to the present embodiment.

FIG. 15 is a schematic view of a cross-section of the part illustrating the liquid level height h of the alcohol AH entering the microvoid MV in a case where the mixture is to be formed, for example, by means of wiping with the alcohol (AH) the part immediately before installation, immersing the part in the alcohol AH in advance, or the like. It is conceivable that examples of the alcohol AH include, but are not limited thereto, ethanol (EtOH), propanol (n-ProOH), isopropyl alcohol (IPA), and the like. FIG. 16 is a schematic view of a cross-section of the part illustrating the liquid level height h of the liquid moisture ML in a case where the liquid moisture ML enters the microvoid MV under the same condition.

Based on Equation (1), assuming that the contact angle θ, the gravitational acceleration g, and the inner diameter r are constants under the same conditions, and comparing the values of T/ρ for each of the liquid moisture ML and the alcohol AH, the liquid level height h of the alcohol AH illustrated in FIG. 15 becomes about 40% of the liquid level height h of the water illustrated in FIG. 16. That is, the liquid moisture ML proves about 2.5 times higher than the alcohol AH in the easiness of entering the microvoid MV.

Therefore, with the means such as wiping with the alcohol (AH) the part surface SF immediately before installation or immersing the part in the alcohol AH in advance, the alcohol AH cannot enter the deepest portion of the microvoid MV into which the liquid moisture ML can enter, and thus the mixture cannot be formed.

Therefore, in order to form the mixture to the deepest portion of the microvoid MV, shorten the time required for drying the inside of the vacuum chamber, and appropriately dry the inside of the vacuum chamber, it is preferable to introduce the additional gas GA thereinto after the vacuuming is executed.

According to the embodiment described above, the time required for drying the inside of the vacuum chamber can be shortened, and the inside of the vacuum chamber can be appropriately dried.

It shall be understood that the embodiments disclosed herein are illustrative and are not restrictive in all aspects. The embodiment described above may be omitted, replaced, or modified in various forms without departing from the scope and spirit of the appended claims.

The invention claimed is:

1. A decompression processing method for a substrate processing apparatus the method comprising:

supplying an additional substance mixable with moisture that is in a liquid or a solid state form by a gas supply to an inside of a chamber for processing a substrate in the inside of the chamber;

forming a mixture of the moisture with the additional substance; and decompressing the inside of the chamber via operation of a decompression apparatus that reduces a pressure inside the chamber and removes the mixture in a gaseous form from the inside of the chamber.

2. The decompression processing method according to claim 1, wherein the additional substance contains at least one of alcohol, ammonia, and carbon dioxide.

3. The decompression processing method according to claim 2, wherein in the supplying the additional substance, the additional substance is supplied in a state in which the decompression apparatus controls a pressure inside the chamber to a negative pressure with respect to an external atmosphere pressure.

4. The decompression processing method according to claim 2, further comprising:

raising a temperature inside of the chamber by operation of a temperature controller during the decompressing.

5. The decompression processing method according to claim 1, wherein in the supplying the additional substance, the additional substance is supplied in a state in which the decompression apparatus controls a pressure inside the chamber to a negative pressure with respect to an external atmosphere pressure.

6. The decompression processing method according to claim 5, further comprising:

raising a temperature inside of the chamber by operation of a temperature controller during the decompressing.

7. The decompression processing method according to claim 1, further comprising:

raising a temperature inside of the chamber by operation of a temperature controller during the decompressing.

8. The decompression processing method according to claim 7, wherein in the supplying the additional substance, the additional substance is supplied in a state in which the decompression apparatus controls a pressure inside the chamber to a negative pressure with respect to an external atmosphere pressure.

9. The decompression processing method according to claim 1, wherein the additional substance contains ammonia or carbon dioxide.

10. A decompression processing method for a substrate processing apparatus, the method comprising:

supplying an additional substance by a gas supply to an inside of a chamber for processing a substrate in the inside of the chamber; and decompressing the inside of the chamber via operation of a decompression apparatus that reduces a pressure inside the chamber, wherein the additional substance contains ammonia or carbon dioxide.

11. The decompression processing method according to claim 10, wherein in the supplying the additional substance, the additional substance is supplied in a state in which the decompression apparatus controls a pressure inside the chamber to a negative pressure with respect to an external atmosphere pressure.

12. The decompression processing method according to claim 11, further comprising:

raising a temperature inside of the chamber by operation of a temperature controller during the decompressing.

13. The decompression processing method according to claim 11, wherein in the supplying the additional substance, the additional substance is supplied to achieve a pressure lower than each vapor pressure of the additional substance and a mixture of the additional substance and moisture.

14. The decompression processing method according to claim 13, wherein the supplying the additional substance and the decompressing are alternately repeated.

15. The decompression processing method according to claim 13, wherein in the supplying of the additional substance, the additional substance is supplied to achieve a pressure higher than a pressure at which the moisture that is in a solid state or the mixture in a solid state melts and lower than a vapor pressure of the additional substance.

16. The decompression processing method according to claim 11, wherein the supplying the additional substance and the decompressing are alternately repeated.

17. The decompression processing method according to claim 10, further comprising:

raising a temperature inside of the chamber by operation of a temperature controller during the decompressing.

18. The decompression processing method according to claim 17, wherein the supplying the additional substance and the decompressing are alternately repeated.

19. The decompression processing method according to claim 10, wherein the supplying the additional substance and the decompressing are alternately repeated.

20. A substrate processing apparatus comprising:

a chamber for processing a substrate in an inside thereof;

a decompression apparatus that reduces a pressure inside the chamber;

a gas supply that supplies a gas into the inside of the chamber; and circuitry configured to control operations performed by the substrate processing apparatus, wherein the circuitry is configured to control a gas supply to supply an additional substance mixable with moisture in a liquid or solid state form into the inside of the chamber, the moisture and the additional substance form a mixture, and a decompression apparatus that decompresses the inside of the chamber to remove the mixture in a gaseous form from the inside of the chamber.

* * * * *